United States Patent [19]
Allen

[11] Patent Number: 5,739,964
[45] Date of Patent: Apr. 14, 1998

[54] MAGNIFICATION CORRECTION FOR SMALL FIELD SCANNING

[75] Inventor: Paul C. Allen, Beaverton, Oreg.

[73] Assignee: Etec Systems, Inc., Nev.

[21] Appl. No.: 409,251

[22] Filed: Mar. 22, 1995

[51] Int. Cl.⁶ ..................................................... G02B 17/00
[52] U.S. Cl. ......................................................... 359/727
[58] Field of Search ........................... 359/727, 732–736, 359/649–651, 676, 679, 720

[56] References Cited

U.S. PATENT DOCUMENTS

| | | | |
|---|---|---|---|
| 3,819,265 | 6/1974 | Feldman et al. | 355/51 |
| 3,909,834 | 9/1975 | Sanada et al. | 354/168 |
| 4,171,870 | 10/1979 | Bruning et al. | 350/173 |
| 4,748,477 | 5/1988 | Isohata et al. | 250/440.1 |
| 4,749,867 | 6/1988 | Matsushita et al. | 250/442.1 |
| 5,285,236 | 2/1994 | Jain | 355/53 |
| 5,298,939 | 3/1994 | Swanson et al. | 355/53 |
| 5,401,934 | 3/1995 | Ainsworth, Jr. et al. | 219/121.18 |
| 5,559,629 | 9/1996 | Sheets et al. | 359/364 |

FOREIGN PATENT DOCUMENTS

| | | |
|---|---|---|
| 0354148 A2 | 2/1990 | European Pat. Off. . |
| A 4030411 | 2/1992 | Japan . |

OTHER PUBLICATIONS

Goodall, F., et al., "Excimer Lasers As Deep UV Sources for Photolithographic System", *Microelectronic Engineering*, 5:445–452 (1986).

Muller et al., "Large Area Fine Line Patterning by Scanning Projection Lithography," MCM '94 Proceedings, 1994, pp. 100–104.

Greed, Jr., et al., "Variable Mangification in a 1:1 Projection Lithography System," SPIE vol. 334 Optical Microlithography Technology for Mid–1980s 1982, pp. 2–9.

*Primary Examiner*—David C. Nelms
*Assistant Examiner*—John P. Cornely
*Attorney, Agent, or Firm*—Skjerven, Morrill, MacPherson, Franklin & Friel; Norman R. Klivans; David T. Millers

[57] ABSTRACT

Magnification correction for small field scanning of large blanks is provided by adding magnification adjusting elements (lenses) to a double pass Wynne-Dyson lens or other type of one-to-one projection lens. The magnification adjusting optical elements includes two pairs of low power lenses, one associated with each of the input and output prisms of a Wynne-Dyson lens. Movement of the magnification adjusting optics provides positive or negative magnification as needed to correct for any expansion or compaction of the blank relative to the reticle (mask) and hence maintain alignment. Further magnification correction is provided by a small velocity relative movement between the reticle and the blank by means of a secondary stage in the scan direction. This corrects for any alignment error in the scan direction and may be used independently of the optical correction technique with any type of projection lens.

25 Claims, 14 Drawing Sheets

MAGNIFICATION CORRECTION FOR SMALL FIELD SCANNING

CROSS-REFERENCE TO RELATED APPLICATIONS

This disclosure is related to and incorporates by reference in their entirety co-filed and commonly owned U.S. patent applications Ser. No. 08/412,232, entitled "Scanning Lithography System having Double Pass Wynne-Dyson Optics"; and Ser. No. 08/410,601, entitled "Scanning Lithography System with Opposing Motion".

BACKGROUND OF THE INVENTION

1. Field of the Invention

This invention relates to photolithography and more specifically to magnification correction for small field photolithography scanning.

2. Description of Related Art

The fabrication of flat panel displays (FPD's) for use e.g. in notebook computers is a well known process typically using photolithography techniques similar to those used in integrated circuit (I.C.) processing. However, FPD's are typically fabricated on very large substrates (or blanks). A typical flat panel display measures approximately 8 inches×6 inches; and four or more such displays are fabricated on a single glass blank. Thus the blanks for flat panel displays are much larger than integrated circuits (ICs) and larger than silicon substrates, which are typically no more than 12 inches in diameter, used in IC fabrication.

Conventional single projection lithography systems are ill suited for such large blanks because of the high cost of optics which can project a precise image the size of the blank.

Conventional step-and-repeat lithography systems, such as those manufactured by Nikon Precision, Inc. and MRS, Inc., partition a blank into blocks which are individually exposed. Step-and-repeat systems allow use of optics with smaller field size (the size of a block) but have difficulty aligning blocks precisely enough to provide uniform exposure at boundaries between the blocks. Accordingly, the speed of a step-and-repeat system may be reduced by alignments required after each step. Additionally, when patterns for different blocks differ, frequent reticle changes further reduce output. In a typical step-and-repeat system for IC manufacturing, each block is at least the size of a complete IC or die to avoid boundary problems and reticle changes.

Optical systems with fields the size of a complete FPD are often too expensive to be practical. In contrast, small field scanning scans a large reticle, equal in size to the blank, with unity magnification optics to expose overlapping stripes on the blank. Typically, small field scanning systems use less expensive optics with a field only as wide as a single stripe, typically about 30 mm.

Some small field scanning systems include Wynne-Dyson optics and image reversing optic. Conventional Wynne-Dyson optics in such systems are between the reticle and the blank and include an input prism, an output prism, a concave mirror, and optionally a lens. Light from the reticle reflects from the input prism to the concave mirror, back to the output prism, and then out to form an image on the blank. A problem with Wynne-Dyson optics is image reversal caused by the reflections. Image reversal forms a reverted image having a left side which appears to be the right side of the object, and vice versa. Conventional lithography systems are unable to scan using a reverted image projected onto a blank and therefore must add optical elements to remove the image reversal of the Wynne-Dyson optics.

U.S. Pat. No. 5,285,236 entitled "Large-Area, High-Throughput, High-Resolution Projection Imaging System", to Jain, and U.S. Pat. No. 4,171,870 entitled "Compact Image Projection Apparatus", to Burning et al., are incorporated by reference herein in their entirety and describe Wynne-Dyson projection optics having output prisms (or roof prisms) with faces that cause additional refection to remove the image reversal. U.S. Pat. No. 5,298,939 to Swanson et al., entitled "Method and Apparatus for Transfer of a Reticle Pattern onto a Substrate by Scanning", which is incorporated herein by reference in its entirety, describes using two Wynne-Dyson optical systems. A first Wynne-Dyson optical system forms a reverted image of a reticle, and the second Wynne-Dyson optical system reverses the reverted image to form a final image which is erect and non-reversed.

The optical systems described in the above noted patents have disadvantages. For example, roof prisms can cause multiple images if the prism is not precisely fabricated. A roof prism also increases the glass path length which typically reduces field size. The optical system described in Swanson et al. doubles the cost for Wynne-Dyson optics and doubles the space required between the reticle and blank.

Another concern in fabricating flat panel displays is that the blank is typically a glass such as a soda lime glass which unlike the silicon used in IC fabrication, is subject to significant compaction (shrinkage) during high temperature processing steps. Typical compaction of these glass substrates during all of processing is e.g. approximately 10 to 100 parts per million in length and width. The lithography techniques which form patterns on a glass blank must properly align the various masks (reticles) to the blank which shrinks progressively during processing. Typically, the masks or reticles are sized to the nominal size of the image to be lithographed onto the blank. One approach makes a reticle size equal the expected blank size. This undesirably requires accurate characterization of the fabrication process to predict the size of the blank after shrinkage and is relatively expensive and complex.

An alternative is to accept misalignment due to the blank shrinkage. Accepting such misalignment is generally not considered desirable since alignment errors result in degradation of the product and hence increase cost due to decreased yield.

In addition to the shrinkage of the glass blank caused by processing, another complication is that the temperature of a reticle when the reticle is made may differ from the temperature of the reticle during the projection onto a blank. The blank and the reticle expand and contract with temperature, and a difference between the coefficients of thermal expansion for the reticle and blank further complicates alignment. Even if the fabrication process has been characterized and the reticles correspondingly sized, in the absence of tight temperature controls during processing, alignment errors still occur.

Thus broadly a goal of lithography is to improve alignment between a reticle (or other pattern source) and a blank when the blank and/or reticle are subject to dimensional changes during processing.

In flat panel display processing technology, the commercially available MRS stepper (a step-and-repeat system) includes a feature called "panel scale" for a type of magnification correction for flat panel processing. This apparatus includes a non-telecentric object plane which allows the reticle to be moved toward or away from the optics to slightly alter the magnification and focus of the image of a reticle.

In the wafer processing industry, another technique is described in "Variable Magnification in a 1:1 Projection Lithography System" by James J. Greed et al., SPIE Volume 334 Optical Microlithography-Technology for the Mid-1980s, 1982. A Perkin-Elmer apparatus is intended to correct for temperature effects on reticles and wafers in a conventional integrated circuit semiconductor fabrication scanning mask aligner. In such scanning mask aligners, each scanning stripe exposes a pattern at least as wide an entire I.C. die on the wafer. Scanning the image of the reticle across the wafer exposes patterns for multiple dice.

This differs from small field scanning such as used in fabricating flat panel displays. For flat panel display fabrication, each individual display on the blank is exposed by several overlapping stripes. Thus, small field scanning involves stripe abutment and alignment concerns not present in a conventional stepper systems and requires optical projection systems different from a stepper or an scanning mask aligner for ICs.

Photolithographic techniques for small field scanning of large blanks, such as used for fabrication of structures including flat panel displays, multi-chip modules, ICs, and printed circuit boards, need improvement.

SUMMARY OF THE INVENTION

In accordance with the invention, two types of apparatuses and methods provide optical magnification correction and relative motion magnification correction for small field photolithography scanning. These apparatuses and methods may be used in conjunction or independently as described below.

One type of apparatus provides optical magnification correction through magnification adjusting optics. One embodiment of the magnification adjusting optics has two sets of lens elements, one associated with light entering, and one associated with light leaving a projection lens. The projection lens may be of any type and is not restricted to the conventional or the double pass Wynne-Dyson optics disclosed below. Each set of lens elements contains a plano-convex element and a plano-concave element which define a narrow meniscus air gap. The elements are long radius, low power elements of equal radii and provide a combination with almost no optical power. Moving the elements to narrow one air gap and widen the other air gap slightly changes magnification and image size produced by the projection lens.

Another embodiment includes a projection lens which is a double pass Wynne-Dyson optical system having unity magnification. The double pass Wynne-Dyson optical system includes an input reflector, a lens, a concave mirror, folding optics, and an output reflector. The input reflector receives light from an object and reflects the light through a first quadrant of the lens. The concave mirror has the same optical axis as the lens and reflects light from the first quadrant of the lens back through a second quadrant of the lens, into the folding optics. The folding optics directs light from the second quadrant of the lens through a third quadrant of the lens and back to the concave mirror. The concave mirror reflects light from the third quadrant of the lens through a fourth quadrant of the lens and into the output reflector. The output reflector reflects light from the fourth quadrant of the lens into a plane where a final image forms. The focusing properties of the lens and the mirror are typically selected so that the double pass Wynne-Dyson optical system has a magnifying power of one, and forms and intermediate image in a middle plane of the folding optics. Typically, the input reflector, the output reflector, and the folding optics include an input prism, an output prism, and a folding prism respectively.

The double pass Wynne-Dyson optical system is modified in one embodiment to provide magnification correction by including magnification adjusting optics associated with the input and output prisms or by including magnification adjusting optics in the folding prism. In one embodiment of the magnification adjusting optics, each of the input and output prisms has an associated set of elements. Each set contains a plano-convex element and a plano-concave element which define a narrow air gap and operate as described above.

A field stop inserted in a gap formed in the folding prism facilitates accurate imaging of a selected portion of the object plane. This eliminates the need for an aperture in the illumination system which must be precisely aligned with the imaging optics to select the portion of the reticle imaged. There is no requirement to use both the field stop and the magnification adjusting optics; they function independently, and each provides its own advantages.

The magnification adjusting optical elements may be conventional spherical lenses with their optical axis approximately coincident with the centers of the input and output prisms so that a ray along the optical axis of the magnification adjusting elements is reflected along a line through the center of the field stop. Alternatively, in a double pass Wynne-Dyson optical system, the magnification adjusting optical elements are each quarter sections of a circular element and are bonded to the input and output prisms, so that the optical axis of these quarter sections is coincident with the optical axis of the remainder of the elements of the system.

In another embodiment, the magnification adjusting lens elements are inserted inside the gap in the folding prism. In this embodiment, the magnification adjusting optics contains only three elements, a central symmetric convex (or concave) element and two corresponding plano-concave (or plano-convex) elements bonded to inside surfaces of the folding prism. The magnification adjustment in this embodiment is accomplished by moving the central symmetric element slightly to provide positive or negative magnification correction.

The magnification adjusting optics are effective in changing the magnification of the small field so as to match the image from the reticle to any compaction (or expansion) of the blank and is independent of the projection lens type. In particular, embodiments of magnification optics in accordance with this invention are not limited to the double pass Wynne-Dyson optical systems or any other particular type of projection system.

In addition to optical magnification correction, it has been found beneficial to move the reticle relative to the blank in a continuous fashion while scanning, so as to correct for the compaction (or expansion) of the blank relative to the reticle over the entire length of the blank. The relative motion can compensate for the reticle and blank being different in length along a scanning direction. Relative motion of the reticle and blank is also advantageous to compensate for length differences along an indexing direction perpendicular to the exposed stripes.

Thus to provide full magnification correction in a small field scanning system, a combination of optical image correction and relative reticle-blank movement is advantageous. The relative motion between the blank and the reticle may be on the part of either. A slight relative velocity is imparted to either the reticle or the blank as the two are being scanned, for instance by means of a secondary stage which moves the reticle or blank relative to the other. The amount of relative velocity is proportional to the amount of magnification correction required. Hence, any alignment error in the scan direction due to blank compaction or expansion can be corrected.

The relative motion magnification correction is independent of the optical magnification correction, and each may be used independently. Use of the relative motion magnification correction can selectively correct magnification in one direction. For example, one could adjust the separation of each scan stripe by a distance which divides the total magnification correction needed among all of the stripes in the indexing direction. Without optical magnification correction, some residual uncorrected misalignment remains, i.e. the 10 to 100 parts per million of the blank compaction across the diameter of the scan field, which is typically 30 to 40 mm.

The relative motion between the reticle and the blank may be provided in any number of ways, and the embodiment disclosed herein of a secondary stage for the reticle or blank moving relative to the stage holding the other of the reticle or blank is merely one example. Typically, this relative motion is provided by a microstepper or other precision motor driving the secondary stage under control of a conventional control mechanism receiving feedback from the reticle alignment system.

BRIEF DESCRIPTION OF THE DRAWINGS

Use of the same reference symbols in different figures indicates similar or identical items.

DETAILED DESCRIPTION OF THE PREFERRED EMBODIMENTS

Opposing Motion Scanning

Figure 1:
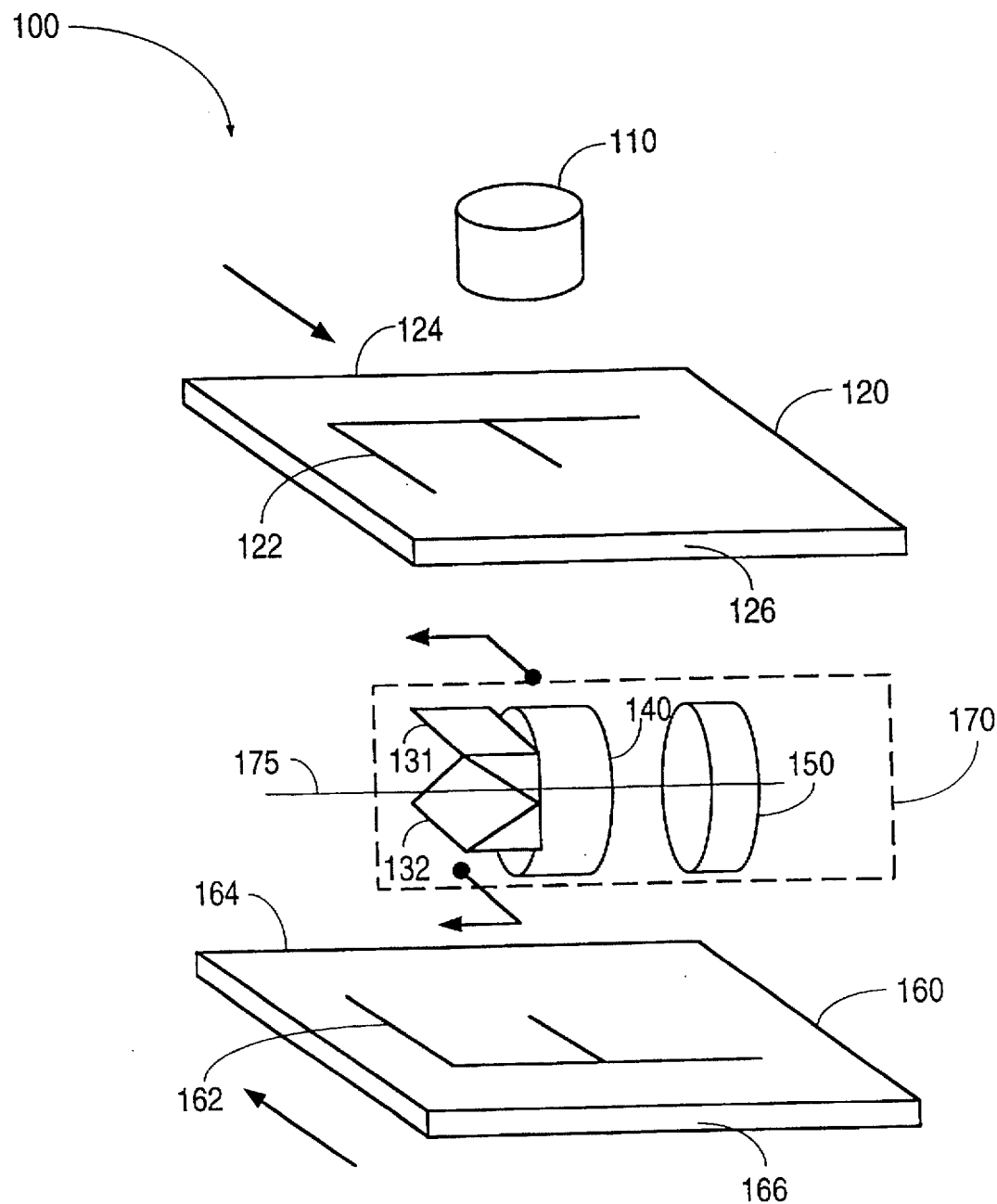
FIG. 1 shows a perspective view of an illuminator, a reticle, projection optics, and a blank in a photolithography system in accordance with an embodiment of this invention.

FIG. 1 is a perspective view of major optical components in a small field scanning photolithography system 100 which employs opposing motion scanning in accordance with an embodiment of this invention. In system 100, a blank 160, typically a semiconductor wafer, a circuit board, or glass substrate coated with light sensitive photoresist or emulsion, is mounted on a support (not shown) parallel and opposite to a reticle 120 on its own support having an opaque pattern 122 to be transferred to blank 160. A conventional illuminator 110 such as a laser or a mercury arc lamp illuminates a portion of reticle 120 with light at wavelengths capable of changing (or "exposing") the photoresist on blank 160. Illuminator 110 may be movably mounted or may contain optics for changing the portion of reticle 120 illuminated. Illuminator 110 typically contains a field stop (not shown) which restricts illumination of reticle 120 to a region having a preselected size and shape.

A conventional Wynne-Dyson optical system 170 collects the light passing through reticle 120 and forms a portion of an image 162 on blank 160. Wynne-Dyson optical system 170 includes an input prism 131, a lens 140, a mirror 150, and an output prism 132. Typically, lens 140 is a converging lens, and mirror 150 is a concave spherical mirror. The term Wynne-Dyson optical system as used herein includes a catadioptric lens with one reflecting surface and is not limited to an optical system where lens 140 and concave mirror 150 have approximately the same center of curvature. Light collected by input prism 131 passes through the upper half of lens 140 before being reflected by concave mirror 150. Light reflected from concave mirror 150 passes through the lower half of lens 140, and output prism 132 reflects that light onto blank 160 forming a portion of image 162 on blank 160.

The imaging properties of Wynne-Dyson optical system 170 is determined primarily by lens 140 and concave mirror 150. Typically, lens 140 and concave mirror 150 have separation and focal lengths selected to form a unity magnification image on blank 160 because at unity magnification, symmetry of the optical system causes the transverse aberrations, distortion, lateral color aberrations, and coma to be identically zero. Optical system 170 has a field which is smaller than the size of pattern 122 on reticle 120 and image 162 on blank 160.

Scanning by moving reticle 120 and blank 160 relative to illuminator 110 and optical system 170 exposes a stripe as wide as the aperture of optical system 170 and as long as the distance moved. If the stripe is narrower than the width of blank 160, the remaining portions of blank 160 are exposed by indexing (i.e. shifting perpendicular to the stripe) either optical system 170 and illuminator 110 or reticle 120 and blank 160. After indexing a next stripe is exposed.

During scanning, motion perpendicular to an optical axis 175 of lens 140 and optical mirror 150 cannot be performed in a conventional manner, such as moving illuminator 110 and optical system 170 relative to reticle 120 and blank 160, because the combination of reflections by input prism 131, concave mirror 150, and output prism 132 in optical system 170 causes image 162 to be reverted along a reverted axis which is perpendicular to optical axis 175. For image 162 to be correctly formed, a left edge 126 of reticle 120 must be imaged on a right edge 164 of blank 160, and a right edge 124 of reticle 120 must be imaged on a left edge 166 of blank 160. Printing pattern 122 mirrored along axis 175 and moving reticle 120 and blank 160 in opposite directions perpendicular to axis 175 corrects for the image reversal. Moving reticle 120 and blank 160 in opposite directions has the advantages of offering near recoilless operation during acceleration of reticle 120 and blank 160 and allows use of relatively simple Wynne-Dyson optical system 170.

Figure 2A:
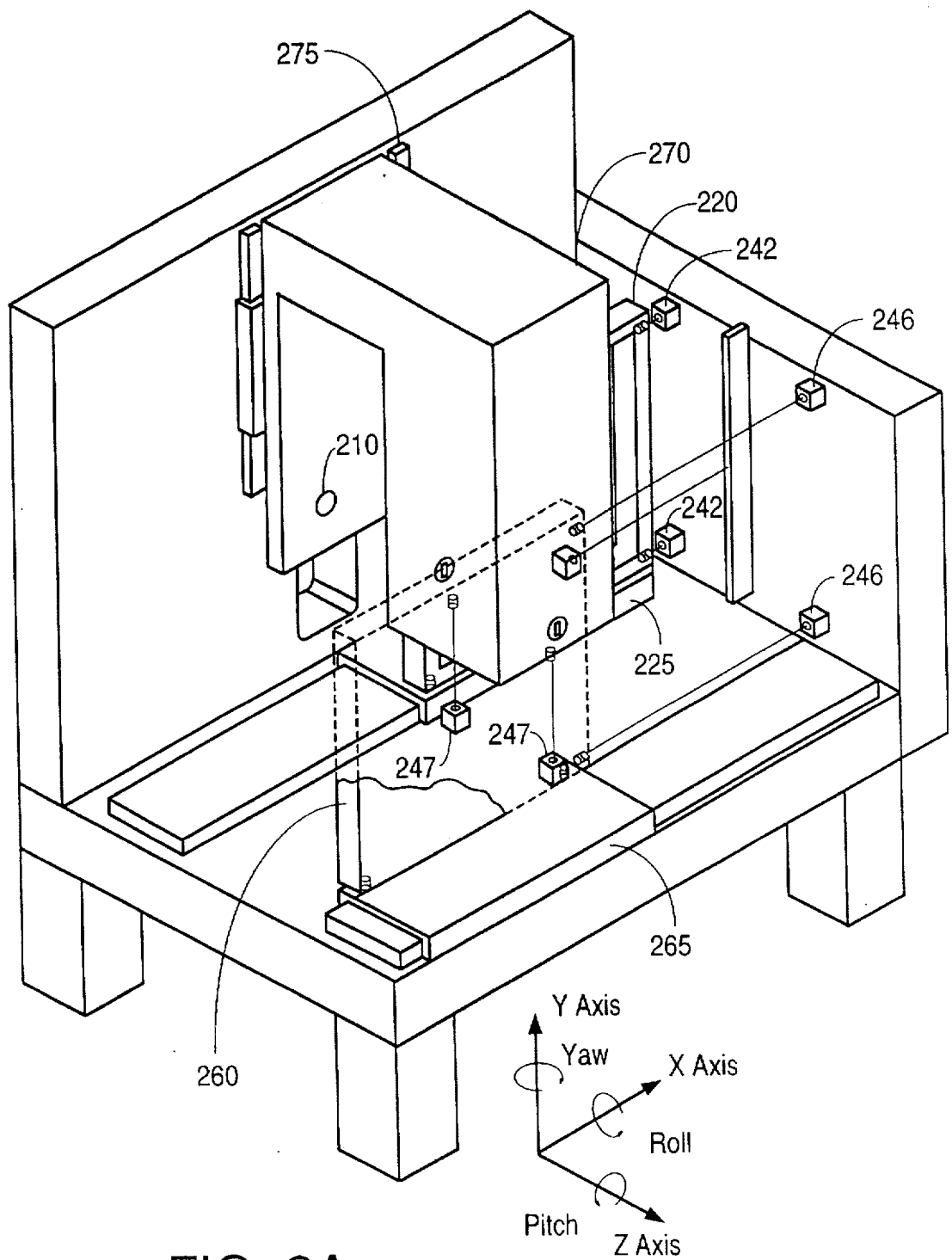
FIGS. 2A, 2B, 2C, and 2D show views of alternative embodiments of the system of FIG. 1.

FIG. 2A shows a perspective view of a photolithography system which employs projection optics, such as optical system 170, which forms a reverted image. The projection optics are mounted in a lens housing 270 which contains an aperture 210 through which light from illuminator 110 reaches the projection optics. Lens housing 270 is mounted on a precision stage 275 which moves the projection optics and aperture 210 along a Y axis. The Y axis is perpendicular to the reverted axis of the projection optics. Typically, stage 275 is an air bearing stage moved by a linear motor operated by a control unit (not shown). Position measurement devices 247, such as laser interferometers, measure the position of lens housing 270 and transmit the measurements to the control unit.

Reticle 120 is mounted on a secondary stage 220 which is mounted on a stage 225. Blank 160 is mounted on a secondary stage 260 which is mounted on a stage 265. The control unit controls movement of stages 220, 225, 260, and 265 according to measurements provided by measurement devices 242 and 246 and a conventional alignment system (not shown) in lens housing 270. Secondary stage 220 is a precision stage capable of movement along the Y axis and rotation about a Z axis for conventional alignment operations which align reticle 120 with blank 160. Secondary stage 260 is a precision stage capable of movement along the X axis for fine motion control and movement along the Z axis to move the surface of blank 160 to the image plane of the projection optics. Stages 225 and 265 are precision stages, such as air bearing stages, which move along the X axis, the axis reverted by the projection optics. Movement along the X axis can be for scanning or indexing. The control unit controls linear motors which move reticle 120 (stage 220) in a direction opposite to the movement of blank 160 (stage 260), but a slight difference in movement may be imparted to correct magnification as described below.

Figure 2B:
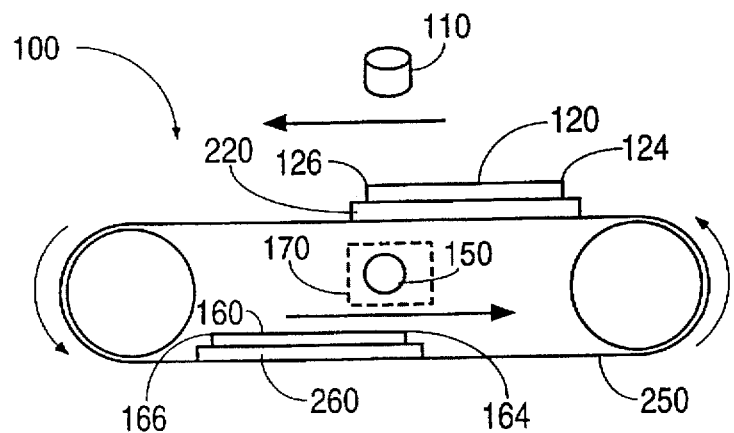
Figure 2C:
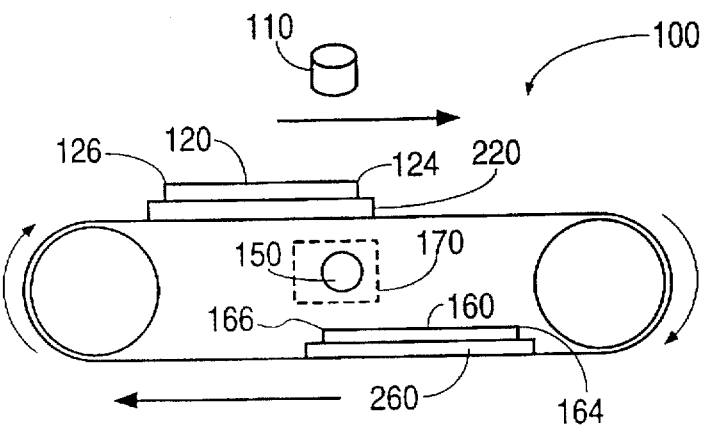

FIGS. 2B and 2C show profile views of another mechanism for moving reticle 120 and blank 160 during scanning or indexing. Reticle 120 and blank 160 are mounted on stages 220 and 260 respectively which are mounted on a drive belt system 250. In one embodiment, belt system 250 moves reticle 120 and blank 160 in opposite directions while exposing a stripe on blank 160. FIG. 2B shows starting positions of reticle 120 and blank 160 for a stripe. In the starting position, optical system 170 forms an image of left edge 126 of reticle 120 on right edge 164 of blank 160. Reticle 120 and blank 160 move in opposite directions while optical system 170 forms a stripe of image 162, until reticle 120 and blank 160 reach the position shown in FIG. 2C where optical system 170 forms an image of right edge 124 of reticle 120 on left edge 166 of blank 160.

Belt system 250 keeps motions and displacements of reticle 120 and blank 160 equal and opposite which reduces recoil and vibrations which may disturb imaging. Stage 220 or 260 can change the relative motion and displacements of reticle 120 and blank 160 to compensate for shrinkage of blank 160 or correct the magnification of optical system 170. Magnification correction is disclosed in greater detail below.

Once reticle 120 and blank 160 reach the positions shown in FIG. 2C, indexing either reticle 120 and blank 160 or illuminator 110 and optical system 170 prepares blank 160 for exposure of another stripe. Stages 220 and 260 can move reticle 120 and blank 160 parallel to axis 175. Alternatively, optical system 170 and the illumination on reticle 120 move in a direction parallel to axis 175 during indexing. The direction of motion of belt system 250 is reversed for formation of the next stripe.

Figure 2D:
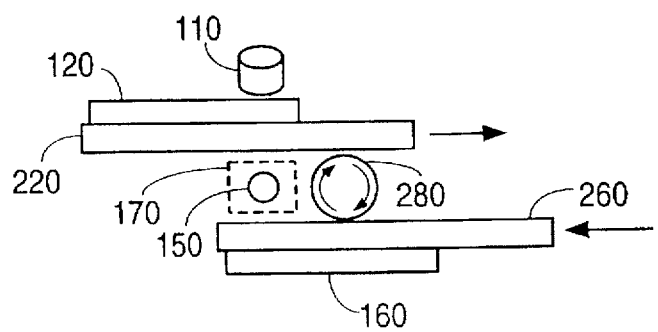

FIG. 2D shows a profile view of capstan or frictional drive mechanism for moving reticle 120 and blank 160 during scanning or indexing. In the system of FIG. 2D, stages 220 and 260 are mounted on precision bearings (not shown) and are in frictional contact with a roller 280. The precision bearings maintain the spacing and orientation of stages 220 and 260 while rotation of roller 280 moves stages 220 and 260 in opposite directions.

Several variations of the scanning method disclosed above are possible. For example, movement of belt system 250 or roller 280 can perform indexing, while stages 220 and 260 move reticle 120 and blank 160 along axis 175 to form stripes. Scanning can be performed in reciprocating directions, or in typewriter fashion in one direction.

Double Pass Wynne-Dyson Optics

Figure 3:
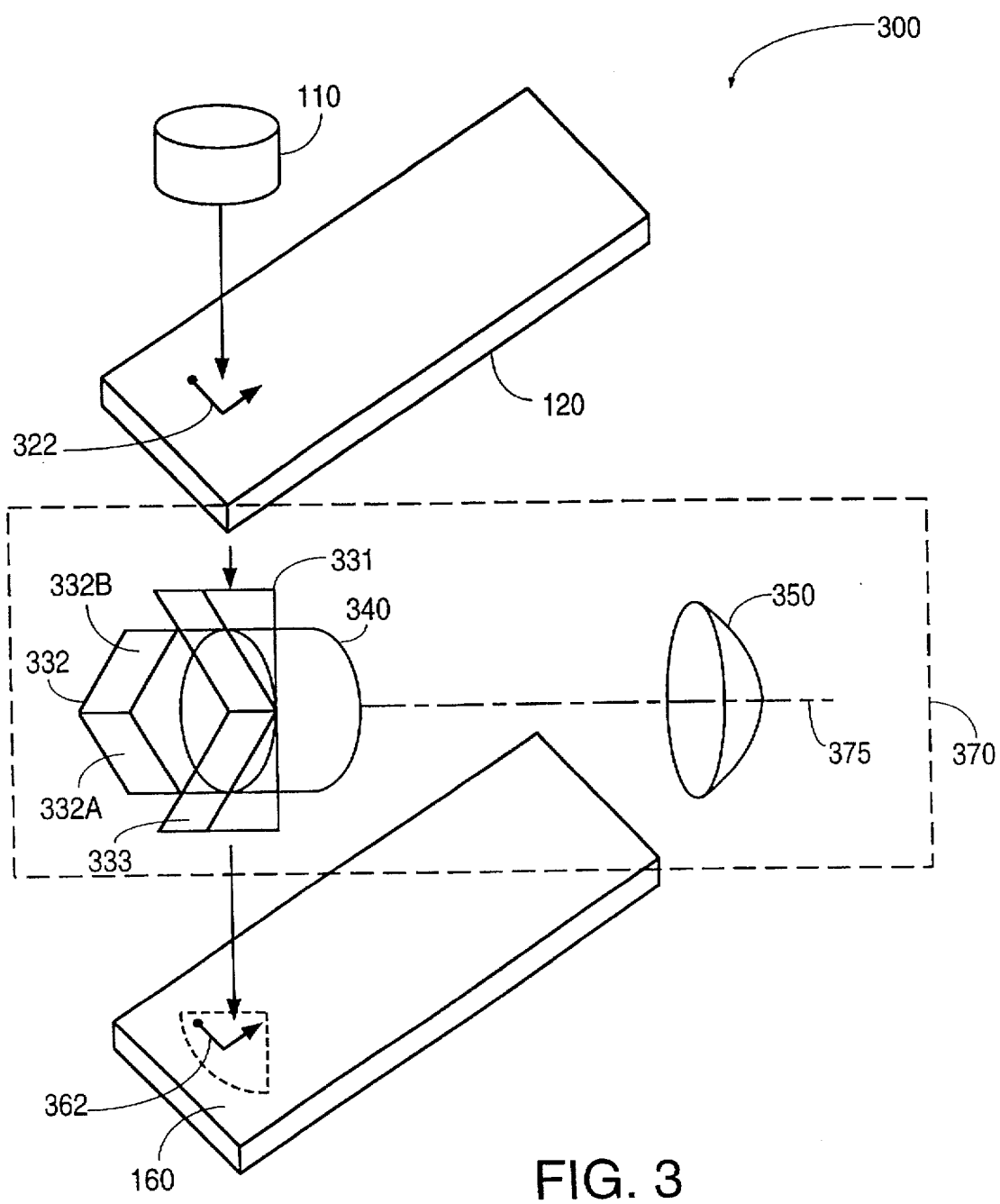
FIG. 3 shows a perspective view of another photolithography system in accordance with an embodiment of this invention.

FIG. 3 shows a small field scanning photolithography system 300 according to another embodiment of the invention. System 300 includes conventional illuminator 110 which illuminates a portion of reticle 120 containing an opaque pattern 322. A double pass Wynne-Dyson optical system 370 in accordance with this embodiment forms on blank 160 a non-reverted image pattern 362 of pattern 322 from the light transmitted through transparent portions of reticle 120. Prism 331 internally reflects incident light from reticle 120 so that the light passes though lens 340 to a concave mirror 350.

Figure 4A:
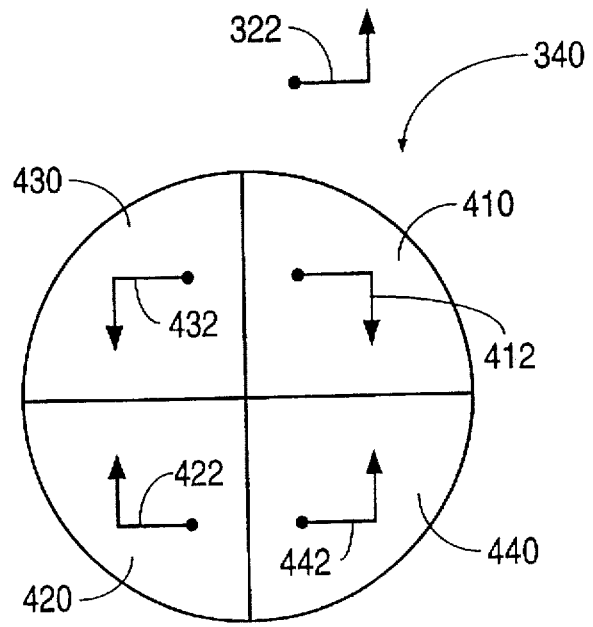
FIGS. 4A and 4B show quadrants of a lens from the embodiment of FIG. 3 and relations between the quadrants and images formed.

FIG. 4A shows a front view of lens 340. Light from prism 331 passes through a first quadrant 410 of lens 340 and is transmitted to concave mirror 350 (FIG. 3). Concave mirror 350 reflects light from quadrant 410 of lens 340 back through a second quadrant 420 of lens 340 into folding optics such as folding prism 332 in FIG. 3. The light is internally reflected off a first face 332A of folding prism 332. Lens 340 and concave mirror 350 are selected so that an image of pattern 322 forms at a middle plane of prism 332. A second face 332B of prism 332 reflects incident light through a third quadrant 430 of lens 340 back to concave mirror 350. Concave mirror 350 reflects light from quadrant 430 back through a fourth quadrant 440 of lens 340 into an output prism 333 which reflects the light onto blank 160.

Light passes through lens 340 four times before being focused on blank 160, which is the equivalent of passing twice through a conventional Wynne-Dyson optical system. The first pass, the optical path from the object plane on reticle 120 to the intermediate image, is completely symmetric with the second pass, the optical path from the intermediate image to final image 362 on blank 160; and the second pass undoes the image reversal caused by conventional Wynne-Dyson optics. FIG. 4A shows the changes in orientation 412, 422, 432, and 442 caused by the reflections at prism 331, concave mirror 350, prism 332, and concave mirror 350, respectively. The orientation of the pattern 322 is the same as the orientation of the image 362. Accordingly, conventional processes for moving reticle 320 and blank 360 in the same direction relative to illuminator 110 and optical system 370 may be employed.

Figure 4B:
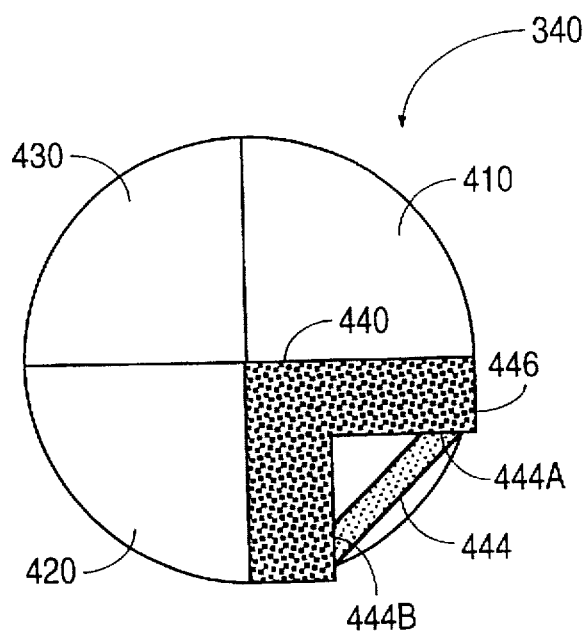

A trapezoidal aperture 444 shown in FIG. 4B is typically used to provide even exposure during scanning. As is well known in the art, sloped sides 444A and 444B of aperture 444 provide less light nearer the edges of a stripe so that the combined exposure of overlapping stripes does not overexpose (or underexpose) the edges of the stripes.

The size of aperture 444 and therefore the width of stripes exposed during scanning depends upon the usable area of lens 340. An area 446 of lens 340 near the diameters which divide the lens into quadrants 410, 420, 430, and 440 is unusable because vignetting caused by input and output prisms 331 and 333 as disclosed below. Aperture 444 maximizes the width of each stripe when the scanning direction is perpendicular to the parallel sides of aperture 444. For this orientation, an optical axis 375 of lens 340 and concave mirror 350 is at a 45° angle with the scanning direction.

A typical goal for optical system 370 for use in flat panel display photolithography is a resolution of at least 2 microns and a useable field size or stripe width, as determined by the mean width of aperture 444, of at least 30 mm. The resolution requirement translates into a numerical aperture (NA) greater than 0.17 at a wavelength X of 436 nm using the rule R=0.8 λ/NA.

In order to analyze double pass Wynne-Dyson optical system 370 in a conventional optical design program such as GENII or OSLO available from Sinclair Optics, Inc. of Fairport, N.Y., light rays are unfolded at the four reflections in prisms 331, 332, and 333. This results in an analogous layout having two identical lenses 340 facing each other with prisms 331, 332, and 333 replaced by appropriate glass thicknesses. Distortion and lateral color aberrations are absent because of the symmetry of system 370; and, since the intermediate image plain is telecentric, coma is absent. The design task becomes optimizing the curvatures, thicknesses, and glass types to reduce the optical path differences across the pupil for different field positions at the wavelengths used, and to minimize the field curvature. A challenge of the design is placing the image and object planes (in the actual folded configuration) outside the radius of concave mirror 350 while maintaining adequate thickness of the small low index elements and controlling the aberrations at the edge of the field.

Table 1 lists optical parameters of one specific embodiment of optical system 370, which is optimized at the g (436 nm) and h (405 nm) mercury lines from illuminator 110. I-line designs are possible although more difficult due to the limited selection of non-solarizing optical glasses.

TABLE 1

| Surface | Radius (mm) | Distance (mm) | Material |
| --- | --- | --- | --- |
| 501 | ∞ | 15.173 (Object) | Air |
| 502 | ∞ | 120.1329 | LAKN7 |
| 503 | ∞ | 26.1855 | KF6 |
| 504 | −125.9625 | 143.5505 | SF2 |
| 505 | −280.7935 | 727.8927 | Air |
| 506 | −1010.6241 | −727.8927 | Air |
| 505 | −280.7935 | −143.5505 | SF2 |
| 504 | −125.9625 | −26.1855 | KF6 |
| 509 | ∞ | −101.7174 | LAKN7 |
| 510 | ∞ | 0 (Intermediate image) | |

Figure 5A:
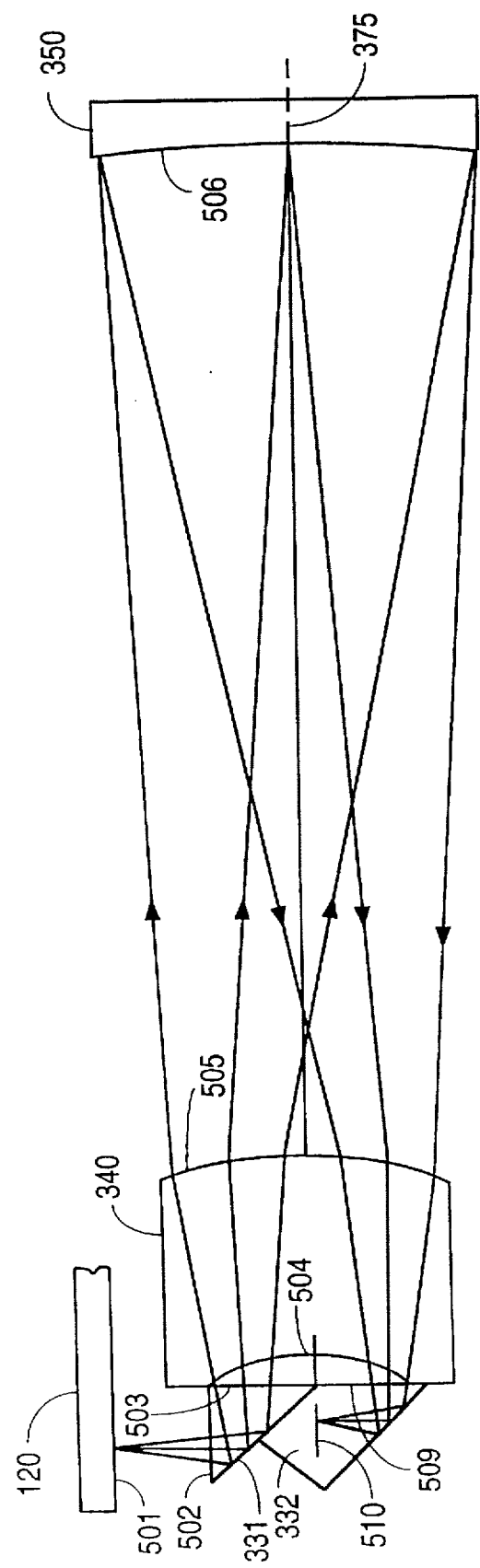
FIGS. 5A and 5B show a ray trace diagram of an embodiment of a double pass Wynne-Dyson optical system in accordance with an embodiment of this invention.

Each row of Table 1 identifies a surface shown in FIG. 5A, a radius of curvature of the surface, a distance to a next surface, and a material traversed to reach the next surface. In Table 1, negative thicknesses indicate rays traveling backward after the reflection from primary mirror 350 at a surface 506. SF2, KF6, and LAKN7 are respectively a light flint glass, a dense flint glass, and a dense crown glass commercially available from Schott Glass Technologies, Duryea, Pa.

The rays shown FIG. 5A travel from an object plane 501 at reticle 120, through input prism 331 of LAKN7 glass, through compound lens 340 having elements of KF6 and SF2 glasses. Compound lens 340 contains an achromat between mirror 350 and the center of curvature of mirror 350 to correct for chromatic aberrations between the 436 nm and 405 nm wavelengths used. Light rays from lens 340 reflect off surface 506 of mirror 350 and pass back through compound lens 340, into folding prism 332 of LAKN7 glass where an intermediate image is formed at a middle plane 510 inside folding prism 332. Output prism 333 which is also made of LAKN7 glass is omitted from FIG. 5A to better illustrate the light rays forming the intermediate image in folding prism 332.

Figure 5B:
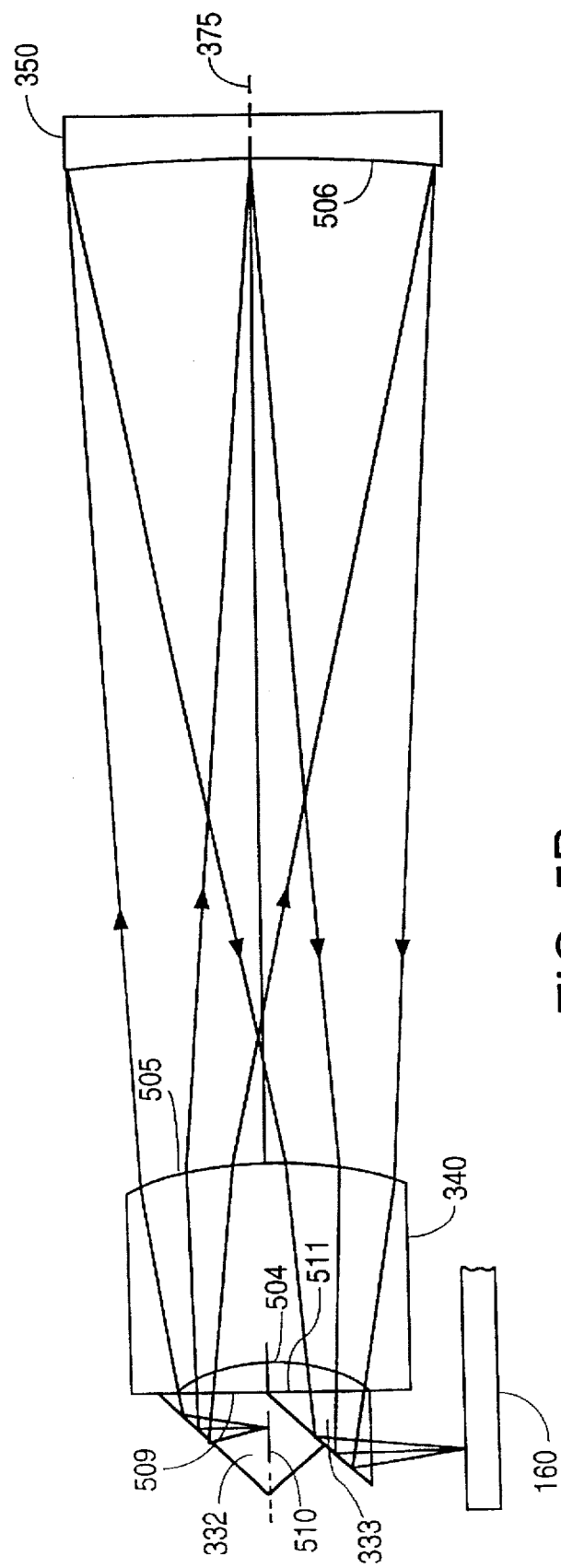

FIG. 5B shows optical system 370 from middle plane 510 of folding prism 332 out through output prism 333 to blank 160. The rays shown in FIG. 5B are completely symmetric with the rays shown in FIG. 5A but traverse the elements in reverse order. The rays traced in FIGS. 5A and 5B are at a full 50 mm field height and set the scale for the lens drawing. The primary mirror is 269 mm in diameter. The length of the assembly, from primary mirror surface to surface of lens 340 to which the prisms 331, 332, and 333 are bonded, is 898 mm.

Table 2 lists design and performance parameters for the embodiment of Table 1.

TABLE 2

| | |
| --- | --- |
| Field radius | 50 mm |
| Maximum useable field width | 41.7 mm |
| Numerical aperture | 0.20 |
| Wavelength correction | 436 & 405 nm |
| Maximum OPD | 0.12 λ |
| Field flatness | 2.6 microns |
| Telecentricity | 3.8 mR |
| Primary mirror clearance | 1 mm |
| Working distance | 15.2 mm |

The field radius is the maximum image ray height from optical axis 375. The maximum useable field width is the longest chord that can be imaged after the field size has been reduce to account for vignetting. The maximum OPD (optical path difference) numbers include both wavelengths at the same focal position and include contributions from field curvature as well as all other aberrations. The field flatness is the total range, in both wavelengths, for the paraxial sagittal and tangential focuses across the unvignetted field. Some improvement can be expected in both the OPD and field flatness performance if these values are optimized for only those field positions used in trapezoidal aperture 444 (FIG. 4B) for overlapping scans. The primary mirror clearance is the available air space between the edge of primary mirror 350 and reticle 120. There may be some opportunity to increase the primary mirror clearance either by forcing the design, decreasing the numerical aperture slightly, or by machining flats on the primary mirror to provide a few more millimeters of clearance. The working distance is the distance between the last optical surface (output prism 333) and the image plane.

An unfolded description of optical system 370 is useful for analysis using a lens design program such as GENII but does not account for vignetting caused by input, output, and folding prisms 331, 333, and 332. However, vignetting can be calculated manually from the geometry of prisms 331, 332, and 333 and optical information from a lens design program. Regions of the field for which principal rays are close to the prism boundaries, near the 45° angles or at the sides, are vignetted.

Figure 6:
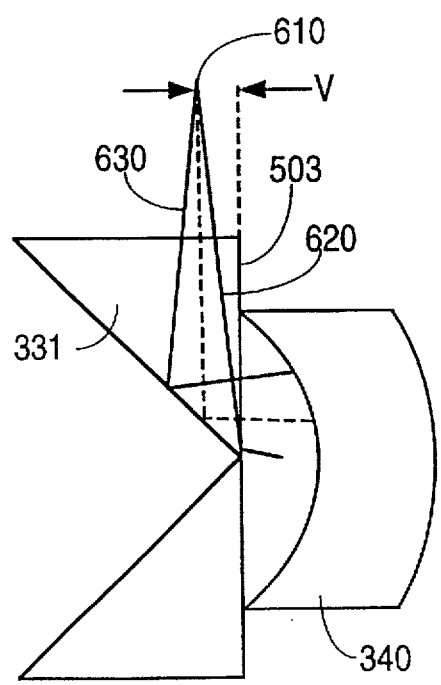
FIG. 6 shows ray traces illustrating vignetting caused by prisms in an embodiment of this invention.

FIG. 6 illustrates a region subject to vignetting. A point 610 on an object has a boundary ray 620 which is the limit of the cone of rays reflected by input prism 331 into optical system 370. Points closer to surface 503 of input prism 331 are in a vignetted region having reduced intensity in the image formed by optical system 370. A width V of the vignetted region is given by the height of the axial marginal ray on surface 503. This is just half of the divergence of the ray bundle leaving an object point at a point where boundary ray 620 leaves prism 331. Aperture 444 of FIG. 4B blocks light in a vignetted region 446 of width V. In the optical system described in Tables 1 and 2, input prism 331 and output prism 333 set the limits for aperture 444 because the optical path length through half of folding prism 332 is less than that through input prism 331 and output prism 333.

Once width V of the vignetted region is known, the useable field is calculated geometrically. FIG. 4B shows the available field after L-shaped vignetted region 446 is removed. Trapezoidal aperture 444 has base length L which is a chord of circular boundary of lens 340. The maximum available chord L in the available field region is given by $$L = \sqrt{2V} \left[ \frac{1}{\tan\phi} - 1 \right], \text{ where}$$

$$\phi = \arcsin\left(\frac{v}{r}\right).$$

For the embodiment of Tables 1 and 2, chord length L is 41.7 mm. For a trapezoid height of 10 mm, the separation between scan lines, stripes, on a blank is 31.7 mm. There is a tradeoff between trapezoid height and scan separation, increasing the height of aperture 444 increase the amount of light through aperture 444 but decreases the separation between stripes. There is also a tradeoff between the numerical aperture and useable field size because vignetted field width V is proportional to the divergence of the rays from the object, which are focused by optical system 370. A system design could change configurations from a high resolution, smaller field size mode to a low resolution, large field size mode. By changing the diameter of an aperture stop (not shown) on mirror 350 and the size of the field stop on illuminator 110 simultaneously, resolution can be traded for field size. A larger aperture stop would be used with a small field stop and vice versa.

The proportion of useable field area appears quite small for the Double Pass Dyson configuration. Two points should be kept in mind: first, because the optical path is folded twice, only one quarter of the circular area of lens 340 is available; and second, the requirement that the object and image planes are parallel and separated by more than the diameter of the primary mirror increases path length and the resultant divergence of the ray bundles. This second effect is common to known Wynne-Dyson optical systems.

The advantages of the Double Pass Dyson approach over a roof prism design such as described in U.S. Pat. No. 4,171,870 to Burning et al. or a double Dyson configurations such as described in U.S. Pat. No. 5,298,939 to Swanson et al. are clear. A roof prism can cause multiple images near the center of the field if the roof angle is not precisely fabricated. A roof prism also increases the glass path length in getting the image past the primary mirror which typically reduces field size significantly. Inserting a field stop into the roof prism configuration would be difficult. The double Dyson approach can provide a large field but at the expense and complexity of building and aligning two lenses instead of one.

Projection System with Magnification Correction Optics

Figure 7A:
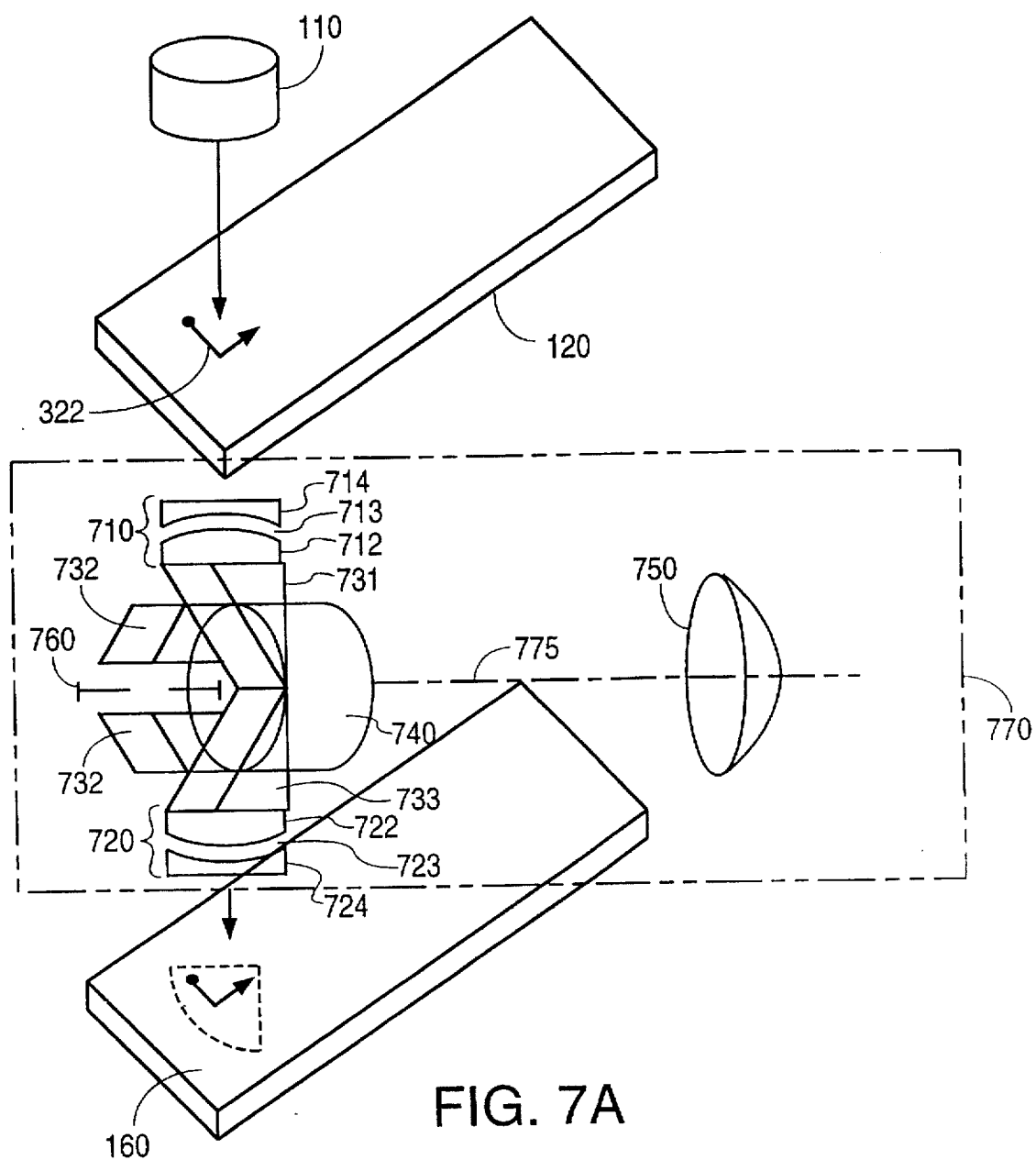
FIGS. 7A, 7B, and 7C show perspective views of portions of a small field photolithography scanning system having double pass Wynne-Dyson optics and magnification adjusting optics in accordance with this invention.

FIG. 7A shows a double pass Wynne-Dyson optical system 770 in accordance with another embodiment of this invention. Optical system 770 incorporates magnification adjusting optics associated with an input prism 731 and an output prism 733. The magnification adjusting optics includes two sets 710 and 720 of long radius lens elements. Each set 710 or 720 includes a plano-convex element 712 or 722 and a plano-concave element 714 or 724 which define a narrow (between about 0.1 mm and 5 mm) meniscus air gap 713 or 723. In optical system 770, plano-convex elements 712 and 722 are bonded to prisms 731 and 732 respectively, and plano-concave elements 714 and 724 are movable relative to plano-convex elements 712 and 722 to adjust the magnification of optical system 770. In an alternative embodiment, plano-concave elements 714 and 724 are bonded to prisms 731 and 732 respectively, and plano-convex elements 712 and 722 are movable.

The radii of elements 712, 714, 722, and 724 are equal, and sets 710 and 720 introduce almost no power into optical system 770. The magnification adjusting optics has a magnification neutral position where both air gaps 713 and 723 are equal and the optical system is perfectly symmetric about the intermediate image plane in the center of folding prism 733. If both negative elements 714 and 724 are moved in the same direction one air gap 713 or 723 narrows, the other air gap 723 or 713 widens, and the magnification and image field size of optical system 770 changes slightly.

A field stop 760 in a gap in the middle of folding prism 732 selects the portion of the intermediate image which forms a final image on blank 160. FIG. 4B shows an exemplary trapezoidal aperture 444 for small field scanning. Field stop 760 eases the requirement of accurately transferring the image of a field stop in illuminator 110 to the object plane (reticle 120). The alignment of field stop 760 in folding prism 732 can be made with respect to lens 740 which is part of the same assembly and makes alignment of input prism 731 and lens 740 to illuminator 110 less critical. Magnification adjusting optics 710 and 720 and field stop 760 in the air gap in folding prism 732 are independent, and alternative embodiments of this invention include optical systems incorporating one or the other.

Figure 7B:
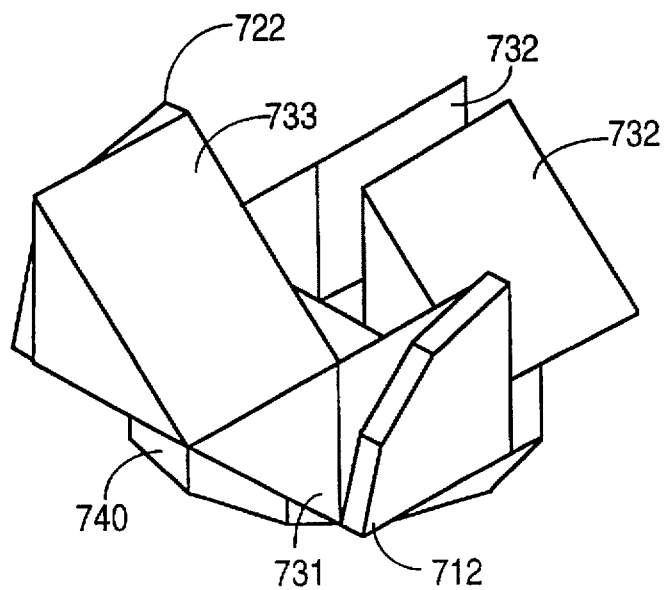
Figure 7C:
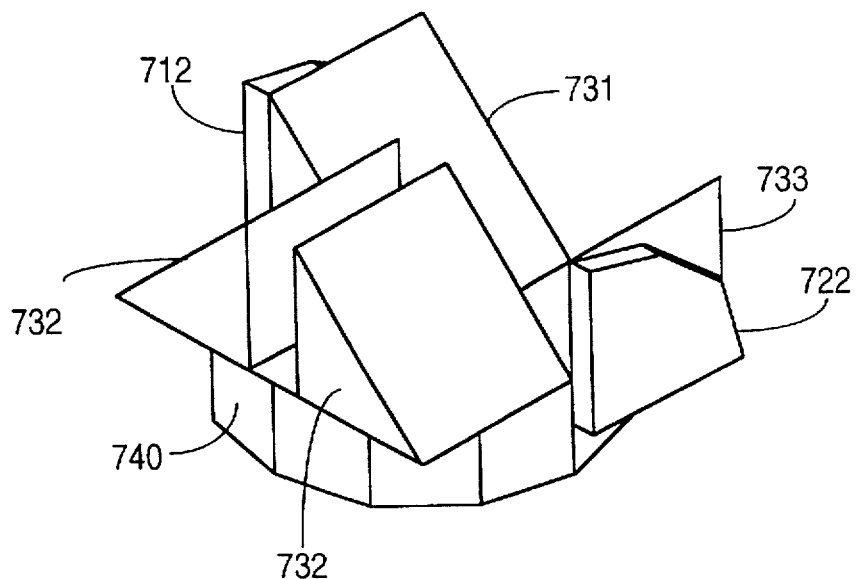

In one embodiment, magnification adjusting elements 712, 714, 722, and 724 are quarter sections of a conventional circular element and aligned with input and output prisms 731 and 733 so that the optical axes of elements 712, 714, 722, and 724, after reflection by prisms 731 and 733, are coincident with an optical axis 775 of lens 740 and mirror 750. FIGS. 7B and 7C show two perspective views of a portion of optical system 770 illustrating the alignment of quarter section elements 712 and 722. Aligning elements 712, 714, 722, and 724 with optical axis 775 preserves more of the optical system's symmetry but may have disadvantages in alignment and fabrication. For this alignment, the stationary point for magnification adjustment is along the optical axis.

Alternatively, elements 712, 714, 722, and 724 can be conventional circular elements aligned so that after reflections, rays along an optical axis of elements 712, 714, 722, and 724 pass approximately through the center of aperture 760. However, exactly aligning elements 712, 714, 722, and 724 with the center of the trapezoidal aperture is unlikely, and some relative movement of the object and image with respect to each element can be expected during magnification adjustments. Accordingly, changing the magnification moves the image relative to the object, and reticle 110 and blank 160 must be aligned after magnification adjustment.

Table 3 shows structural parameters of an embodiment of optical system 770 of FIG. 7A when elements 714 and 724 are in a magnification neutral position.

TABLE 3

| Surface | Radius (mm) | Thickness (mm) | Glass |
|---|---|---|---|
| 801 | ∞ | 10.3763 (Object) | Air |
| 802 | ∞ | 7.000 | LAKN7 |
| 803 | 1999.9997 | 1.000 | Air |
| 804 | 1999.9997 | 6.000 | LAKN7 |
| 805 | ∞ | 112.0661 | LAKN7 |
| 806 | ∞ | 23.5396 | KF6 |
| 807 | −127.2866 | 143.5363 | SF2 |
| 808 | −281.3477 | 727.0806 | Air |
| 809 | −1008.2385 | −727.0806 | Air |
| 808 | −281.3477 | −143.5363 | SF2 |
| 807 | −127.2866 | −23.5396 | KF6 |
| 810 | ∞ | −100.1653 | LAKN7 |
| 811 | ∞ | 4.000 | Air |
| 812 | ∞ | 0 (Intermediate image) | Air |

Table 4 indicates performance and structural parameters of the embodiment of Table 3 when the axes of elements 712, 714, 722, and 724 are aligned with axis 775. Analysis of a system where the axes of elements 712, 714, 722, and 724 is offset from axis 775 provides similar performance.

TABLE 4

| | |
|---|---|
| Field radius | 50 mm |
| Maximum useable field width | 45 mm |
| Numerical aperture | 0.18 |
| Wavelength correction | 436 & 405 nm |
| Magnification range | +/−100 ppm |
| Maximum OPD | 0.12 lambda, 0.08 lambda at 1X mag. |
| Field flatness | 2.4 microns |
| Telecentricity | 2.3 mR |
| Primary mirror clearance | 15.6 mm |
| Working distance | 10.4 mm |

Figure 8A:
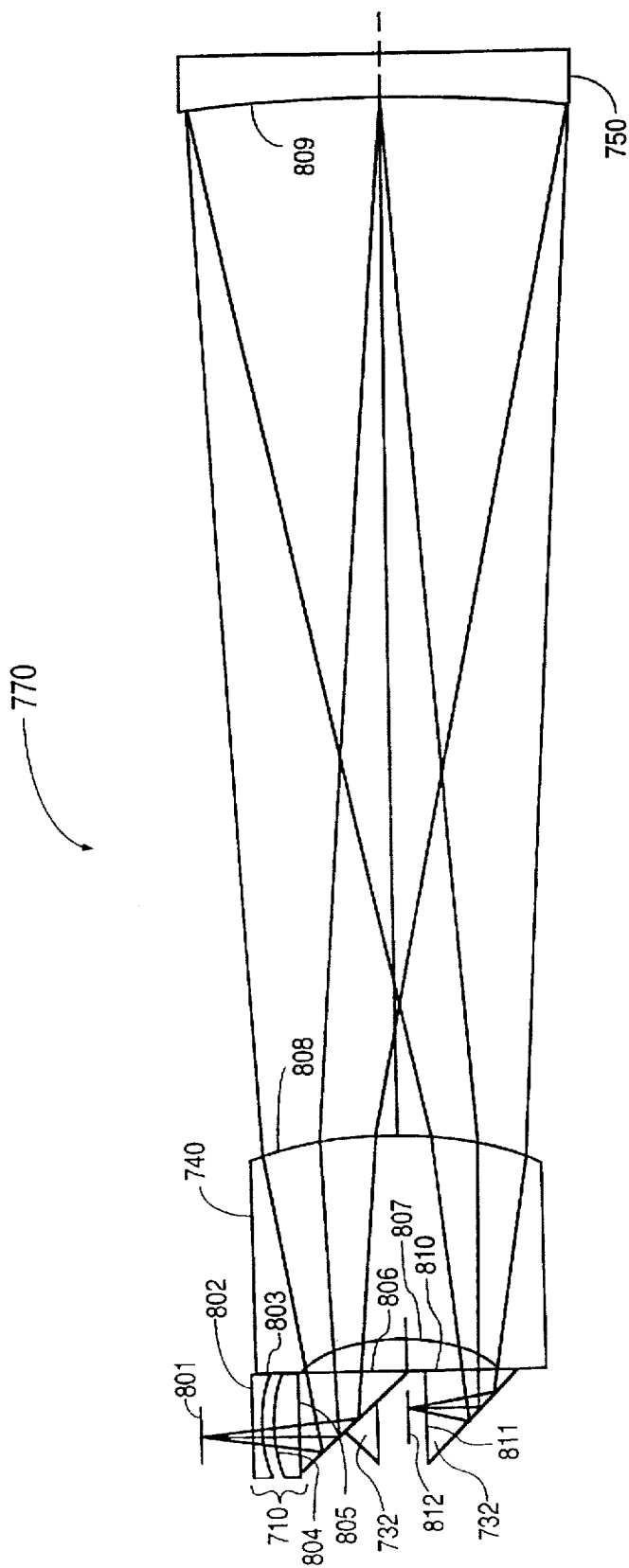
FIGS. 8A and 8B show a ray trace diagram of an embodiment of a double pass Wynne-Dyson optical system in accordance with an embodiment of this invention.
Figure 8B:
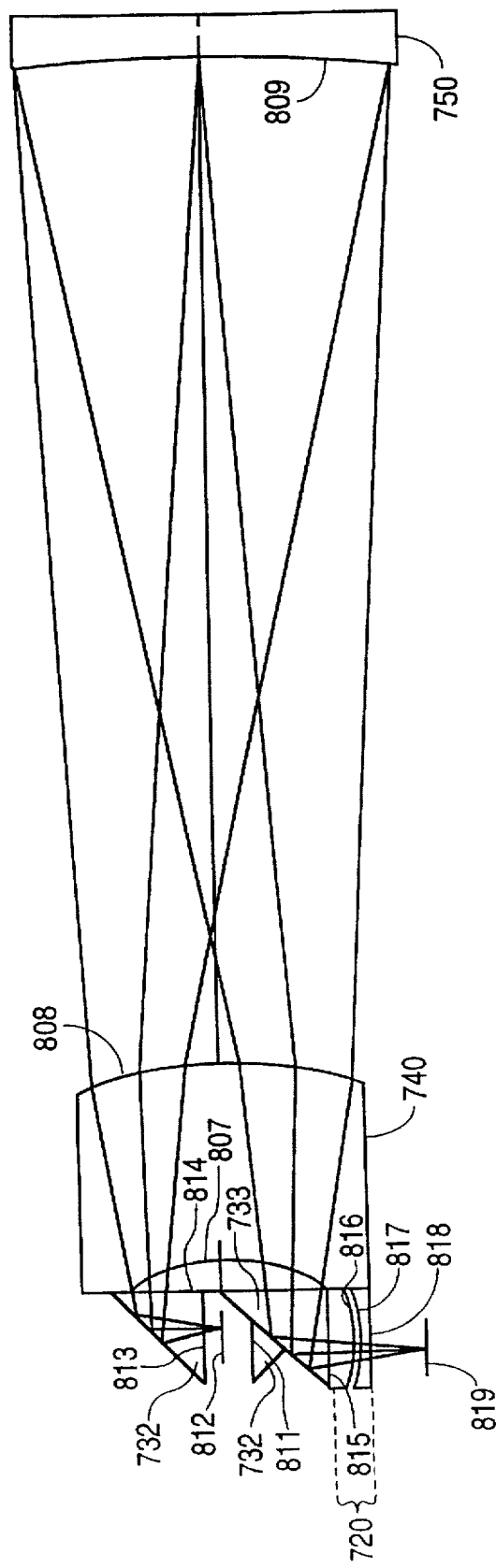

The parameters of Tables 3 and 4 are defined in the same way as the parameters of Tables 1 and 2 above. FIG. 8A shows a ray trace diagram for optical system 770 from an object plane 801 to an intermediate image plane 812 in the middle of folding prism 732, the plane of symmetry for optical system 770. FIG. 8B shows a ray trace diagram from intermediate image plane 812 to a final image plane 819.

The 1 mm air gap 713 between surface 803 and surface 804 is increased (decreased) while air space 723 is decreased (increased) in an equal amount to adjust the magnification of optical system 770 away from unity. Changes of 0.158 mm in air gaps 713 and 723 cause a 100 ppm magnification change. Since very little movement, less than 1 mm, is required for magnification adjustment, movable element 714 (and element 724) can be mounted on flexure bearings and moved by a stepper motor micropositioner, such as those available from Melles Griot, Inc. of Irvine, Calif. The amount of motion required for a given magnification change in this embodiment can be adjusted by varying the power of the four magnification elements.

The optical system of Table 2 is similar to the optical system of Table 4, but there are some notable differences. The numerical aperture in the magnification correcting lens has been reduced from 0.2 to 0.18. This reduces the vignetting, giving a larger useable field size of 45 mm. The smaller N.A. also reduces the diameter of mirror from 269 mm to 242 mm allowing for over 15 mm of clearance to image plane 819. The OPDs in the unity magnification condition are 0.08 λ, giving additional aberration budget for magnification adjustments. For a 10-mm high trapezoid, the scan separation becomes 35 mm; for a 5 mm high trapezoid, scan separation becomes 40 mm. The embodiment of Tables 3 and 4 was optimized at the unity magnification condition only: an optimization over all adjusted magnifications would result in smaller maximum OPDs.

Figure 9:
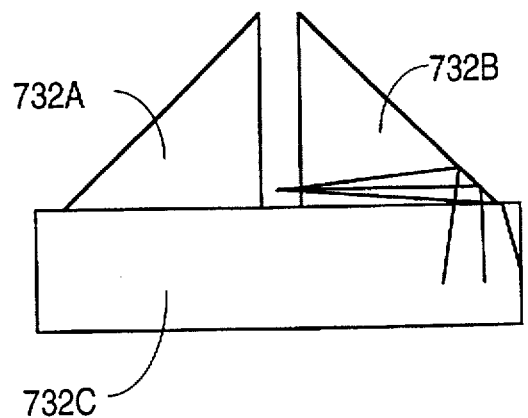
FIG. 9 shows a folding prism with a base block to reduce vignetting.

The introduction of an air gap between surfaces 811 and 813 inside folding prism 732 can cause additional vignetting beyond what is present from input and output prisms 731 and 732. This can be prevented by making the two halves of folding prism 732 large enough to accommodate the field size and the divergence of the image cone through them. The additional glass length required by the optical design can be made up by cementing a block 732C of glass to the base of two prism halves 732A and 732B as shown in FIG. 9. For embodiment of Table 3, the 100.1653 mm of LAKN7 glass path length can be divided into 61 mm for the prism halve 732A (or 732B) and 39.1653 mm for the base 732C. When this is done, the limiting vignetting is caused by input and output prisms 731 and 733.

Figure 10:
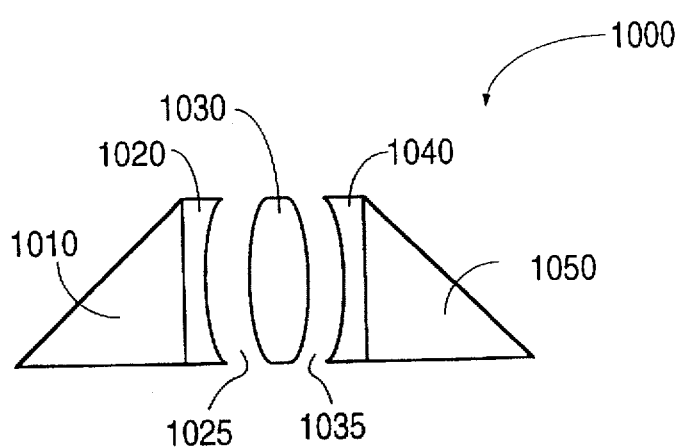
FIGS. 10 and 11 show folding prisms which contain magnification adjusting optics in accordance with this invention.
Figure 11:
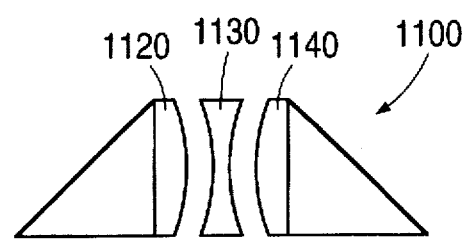

FIG. 10 shows an embodiment of magnification adjusting optics for a double pass Wynne-Dyson optical system wherein a folding prism 1000 contains two meniscus air gaps 1025 and 1035. Folding prism 1000 contains a movable convex element 1030 between two plano-concave elements 1020 and 1040 which are bonded to inside surfaces of portions 1010 and 1050 of folding prism 1000, and moving symmetric element 1030 adjusts magnification.

Movable element 1030 is equivalent to elements 712 and 722 (FIG. 7A) joined to form a symmetric convex element, and elements 1020 and 1040 are equivalent to elements 714 and 724 (FIG. 7A). An alternative folding prism 1100 with magnification adjusting optics has a movable symmetric concave element equivalent to elements 714 and 724 (FIG. 7A) joined, and plano-convex elements equivalent to elements 712 and 722 (FIG. 7A) bonded to inside walls of the folding prism.

Placing magnification adjusting optics in folding prism 1000 has disadvantages. It requires a large cavity in folding prism 1000 to accommodate three elements 1020, 1030, and 1040 which provides more opportunity for vignetting. The intermediate image plane lies inside symmetric element 1030 which must be thick enough to keep its surface and any dust particles on it out of focus. Further, the intermediate image now moves inside element 1030, and there is no opportunity to insert a field stop at that location.

The optical systems disclosed herein can be scaled in size by making the each element larger to obtain larger field sizes. However, fabrication difficulty and expense are important issues at sizes not too much larger than about 1 meter diameter of the described embodiments. Increasing the N.A. of these systems is more difficult both from the vignetting and aberration standpoints. The optimum size for the trapezoidal height, which strongly affects the average width and thus the scan separation, must be addressed in conjunction with the illuminator design. The extension of this approach to use i-line illumination should be straightforward despite the more limited glass selection.

System with Relative Motion to Correct Magnification

For small field scanning lithography, relative motion of the reticle and the blank may be used in addition to optical magnification adjustment to correct for compaction (or expansion) of a blank relative to the reticle. In particular, when the blank shrinks to a size smaller than the reticle, the magnification of the optical system should be decrease to less than one, i.e. to the ratio of the reticle's size to the blank's size, and scanning should expose the reduced area of the blank, not an area the size of the reticle. The relative motion of the reticle and blank can compensate for the reticle and blank having different sizes. For example, exposing a stripe on the blank is often performed by moving the illuminator and the optical system along a scanning direction relative to the reticle and the blank. Continuously moving the blank in the scanning direction reduces the motion of the illuminator and optical system relative to the blank. Relative motion of the reticle and blank is also advantageous to compensate for length differences along an indexing direction perpendicular to the exposed stripes.

Thus to provide full magnification correction in a small field scanning system, a combination of optical magnification correction and relative reticle-blank movement is advantageous. The relative motion between the blank and the reticle may be on the part of either. A slight relative velocity is imparted to either the reticle or the blank as the two are being scanned, for instance by means of a secondary stage which moves the reticle or blank relative to the other. The amount of relative motion is proportional to the amount of magnification correction required. Hence, any alignment error in the scan direction due to blank compaction or expansion can be corrected.

The relative motion magnification correction is independent of the optical magnification adjustment, and each may be used independently. Use of the relative motion magnification correction can selectively correct for differences in one direction. For example, one could adjust the separation of each scan stripe by a distance which divides the total magnification correction needed among all of the stripes in the indexing direction. Without optical magnification correction, some residual uncorrected misalignment remains, i.e. the 10 to 100 parts per million of the blank compaction across the diameter of the scan field, which is typically 30 to 40 mm.

Many systems for moving a reticle relative to a blank are possible, and the embodiment disclosed herein of a secondary stage for the reticle or blank moving relative to the stage holding the other of the reticle or blank is merely one embodiment. Typically, relative motion is provided by a microstepper or other precision motor driving the secondary stage under control of a conventional control mechanism receiving feedback from the reticle alignment system.

The magnification correction schemes described here could be adapted to the other optical configurations that have been discussed: roof prism, double Dyson, conventional Wynne-Dyson, and even telecentric 1× refractive optics.

Although the present invention has been described with reference to particular embodiments, the description is only an example of the invention's application and should not be taken as a limitation. Many other embodiments of the invention are possible. For example, the magnification adjusting optics and/or magnification correction through relative motion of the blank and reticle in accordance with the invention may be employed in variety of projection systems including systems with Wynne-Dyson optics and added elements to remove the image reversal, Wynne-Dyson optics with opposing motion scanning, double pass Wynne-Dyson optics, and other projection optics. The magnification adjusting optics can be attached to input and output prisms or can be internal to the projection optics. Various other adaptations and combinations of features of the embodiments disclosed will be apparent to those skilled in the art and are within the scope of the present invention as defined by the following claims.

We claim:

1. A projection lens assembly, comprising:

projection optics; and magnification adjusting optics, wherein the magnification optics comprises:

a first lens element having a convex surface;

a second lens element having a first concave surface and a second concave surface, the first concave surface being disposed adjacent to the convex surface of the first lens element to define a first gap between the first and second lens elements, wherein the first concave surface has a radius of curvature equal to that of the convex surface of the first lens element;

a third lens element having a convex surface disposed adjacent to the second concave surface of the second lens element to define a second gap between the second and third lens elements, wherein the convex surface of the second lens element has a radius of curvature equal to that of the second concave surface of the second lens element; and means for moving the second lens element relative to the first and third lens elements so that second gap narrows as the first gap widens.

2. A projection lens assembly, comprising:

projection optics; and magnification adjusting optics, wherein the magnification optics comprises:

a first lens element having a first convex surface and a second convex surface;

a second lens element having a concave surface disposed adjacent to the first convex surface of the first lens element to define a first gap between the first and the second lens elements, wherein the concave surface has a radius of curvature equal to that of the convex surface;

a third lens element having a concave surface adjacent to the second convex surface of the first lens element to define a second gap, the concave surface of the third lens element having a radius of curvature equal to that of the second convex surface of the first lens element; and means for moving the first lens element relative to the second lens element and the third lens element so that second gap narrows as the first gap widens.

3. A projection lens assembly, comprising:

projection optics; and magnification adjusting optics, wherein the magnification optics comprises:

a first lens element having a convex surface;

a second lens element having a concave surface disposed adjacent to the convex surface of the first lens element to define a first gap between the first and the second lens elements, wherein the concave surface has a radius of curvature equal to that of the convex surface;

means for moving the first lens element relative to the second lens element to change the first gap;

a third lens element having a convex surface;

a fourth lens element having a concave surface disposed adjacent to the convex surface of the third lens element to define a second gap between the third and the fourth lens elements, wherein the concave surface of the fourth lens element has a radius of curvature equal to that of the convex surface of the third lens element; and means for moving the third lens element relative to the fourth lens element to change the second gap.

4. The projection assembly of claim 3, wherein:

the first and second lens elements are positioned so that light passes through the first and second lens elements before entering the projection optics; and the third and fourth lens elements are positioned so that light from the projection optics passes through the third and fourth lens elements.

5. The projection assembly of claim 3, wherein the radius of curvature to the convex surface of the first lens element is greater than 50 mm.

6. The projection assembly of claim 3, wherein the projection optics comprises a Wynne-Dyson optical system.

7. The projection assembly of claim 6, wherein the Wynne-Dyson optical system further comprises a roof prism system.

8. A projection lens assembly, comprising:

projection optics that includes a double pass Wynne-Dyson optical system; and magnification adjusting optics, wherein the magnification optics comprises:

a first lens element having a convex surface;

a second lens element having a concave surface disposed adjacent to the convex surface of the first lens element to define a first gap between the first and the second lens elements, wherein the concave surface has a radius of curvature equal to that of the convex surface; and means for moving the first lens element relative to the second lens element to change the first gap.

9. A projection lens assembly, comprising:

an input prism having an exterior surface on which an image is incident;

an output prism having an exterior surface from which the image is projected; and magnification adjusting optics comprising a first set of optical elements adjacent the exterior surface of the input prism and a second set of optical elements adjacent the exterior surface of the output prism.

10. The projection lens of claim 9, further comprising a reflective element spaced apart from each of the two prisms and located for reflecting light from the input prism to the output prism.

11. The projection lens assembly of claim 10, further comprising a folding prism adjacent to the input and output prisms, the folding prism being disposed so that light from the input prism that is reflected from the reflective element enters the folding prism, is reflected in the folding prism back to the reflective element, and then reflected from the reflective element to the output prism.

12. The projection lens assembly of claim 9, wherein each of the sets of optical elements in the signification adjusting optics includes at least two lens elements.

13. The projection lens assembly of claim 9, wherein the first set of optical elements includes a plano-convex lens element and a plano-concave lens element having respective convex and concave surfaces adjacent one to another.

14. The projection lens assembly of claim 13, the concave and convex surfaces being of approximately equal radius, and further comprising a gap between the concave and convex surfaces.

15. The projection lens assembly of claim 14, further comprising a magnification adjustment mechanism connected to at least one of the two lens elements, thereby moving one of the two lens elements relative to the other and changing the size of the gap.

16. The projection lens assembly of claim 14, the gap being about 1 mm maximum.

17. The projection lens assembly of claim 9, wherein the lens assembly defines a cavity, and further comprising a field stop located in the cavity.

18. The projection lens assembly of claim 17, further comprising a folding prism that defines the cavity containing the field stop.

19. A projection lens assembly, comprising:

a folding prism that defines a cavity; and magnification adjusting optics located in the cavity.

20. The projection lens assembly of claim 19, wherein the magnification adjusting optics include two plano-convex lens elements and a double concave lens element located between the two plano-convex lens elements.

21. The projection lens assembly of claim 19, wherein the magnification adjusting optics include two plano-concave lens elements and a double convex lens element located between two plano-concave lens elements.

22. The projection lens assembly of claim 19, wherein the magnification adjusting optics includes at least three lens elements spaced apart to define two gaps, wherein adjacent surfaces of each of the three elements are of approximately the same radius.

23. The projection lens assembly of claim 22, further comprising a magnification adjustment mechanism connected to the magnification adjusting optics, thereby altering a width of the two gaps.

24. The projection lens assembly of claim 9, wherein the sets of optical elements include lens elements that are each quarter sections in outside diameter and at least one lens element is bonded to the exterior surfaces of the input and output prisms, the optical axis of each of the quarter sections being coincident with an optical axis of the lens assembly.

25. The projection lens assembly of claim 9, wherein the sets of optical elements include lens elements that have an optical axis offset from an optical axis of other portions of the lens assembly.

* * * * *

UNITED STATES PATENT AND TRADEMARK OFFICE
CERTIFICATE OF CORRECTION

PATENT NO.   :   5,739,964
DATED        :   April 14, 1998
INVENTOR     :   Paul C. Allen It is certified that error appears in the above-identified patent and that said Letters Patent is hereby corrected as shown below:

Col. 3, line 21, delete "an" and insert --a--.

Col. 9, line 18, delete "X" and insert --$\lambda$--.

Signed and Sealed this

Sixth Day of October, 1998

*Attest:*

BRUCE LEHMAN

*Attesting Officer*           *Commissioner of Patents and Trademarks*